United States Patent [19]
Orlowski et al.

[11] Patent Number: 5,552,328
[45] Date of Patent: Sep. 3, 1996

[54] METHOD OF FABRICATION OF POROUS SILICON LIGHT EMITTING DIODE ARRAYS

[75] Inventors: Thomas E. Orlowski, Fairport; Sophie V. Vandebroek, Penfield, both of N.Y.

[73] Assignee: Xerox Corporation, Stamford, Conn.

[21] Appl. No.: 463,162

[22] Filed: Jun. 5, 1995

Related U.S. Application Data

[62] Division of Ser. No. 257,247, Jun. 8, 1994, Pat. No. 5,510,633.

[51] Int. Cl.$^6$ ............... H01L 21/3063; H01L 21/77
[52] U.S. Cl. ............... 437/23; 437/905; 216/56; 156/662.1
[58] Field of Search ............... 257/9, 13, 28, 257/39, 79, 103; 437/23, 228 ST, 233, 127, 905; 216/56; 204/129.3; 156/662.1

[56] References Cited

U.S. PATENT DOCUMENTS

| | | | |
|---|---|---|---|
| 4,587,717 | 5/1986 | Daniele et al. | |
| 5,177,405 | 1/1993 | Kusuda et al. | 257/136 |
| 5,206,523 | 4/1993 | Goesele et al. | 257/103 |
| 5,285,078 | 2/1994 | Mimura et al. | 257/3 |
| 5,324,965 | 6/1994 | Tompsett et al. | 257/103 |
| 5,331,180 | 7/1994 | Yamada et al. | 257/3 |
| 5,348,618 | 9/1994 | Canham et al. | 156/662.1 |
| 5,397,429 | 3/1995 | Hummel et al. | 156/643 |
| 5,438,210 | 8/1995 | Worley | 257/82 |
| 5,438,241 | 8/1995 | Zavracky et al. | 437/21 |
| 5,439,843 | 8/1995 | Sakaguchi et al. | 437/71 |
| 5,454,915 | 10/1995 | Shor et al. | 204/129.3 |
| 5,458,735 | 10/1995 | Richter et al. | 437/173 |

FOREIGN PATENT DOCUMENTS 5-283723  10/1993  Japan.

OTHER PUBLICATIONS

C. C. Yeh, et al, Thin Solid Films 255 (1995) 262 "Porous Si Device Structure of LEDs".

*Primary Examiner*—Charles L. Bowers, Jr.
*Assistant Examiner*—Leon Radomsky
*Attorney, Agent, or Firm*—Lloyd F. Bean, II

[57] ABSTRACT

A porous silicon Light Emitting Diodes (LEDs) device and method for fabricating LEDs with supporting circuits on a silicon chip or wafer for a Full Width Array in which a switch diode structure is used to form the porous silicon LED element and later drives the LED after the LED is fabricated. The LED is formed by defining an area in the switch diode for placing an LED element. Epi silicon is deposited in the defined area; and the epi silicon is electrochemical etched to produce porous silicon. This procedure creates column-like Si structures of nanometer dimension which can efficiently emit visible to infrared light at room temperature. Next, the porous silicon LED chip can be cut and butted without excessive damage. In this way, the chips bearing both LEDs and drive circuitry are made of silicon and can be cut and accurately butted by known techniques to form a low cost, high resolution Full Width LED array.

7 Claims, 11 Drawing Sheets view a-a' view a-a' view a-a' view b-b' view b-b' view b-b' view b-b'

METHOD OF FABRICATION OF POROUS SILICON LIGHT EMITTING DIODE ARRAYS

This is a division, of application Ser. No. 08/257,247, filed Jun. 8, 1994, now U.S. Pat. No. 5,510,633.

The invention relates to Light Emitting Diode Arrays, and more particularly, to a method of fabricating a Porous Silicon Light Emitting Diode Array which may be combined with other like LED arrays to form a full page width image write bar.

The use of an array of Light Emitting Diodes (LEDs) to write images on a recording member such as the photoreceptor of a xerographic type imaging system has taken on renewed interest with the current day interest in electronic image printers. As will be understood, LED arrays typically comprise one or more linear rows of LEDs in close juxtaposition with one another on a single chip or substrate. In electronic printer applications, the individual LEDs of the array are actuated in accordance with an image signal input. The resulting image rays created by the LEDs, which are focused onto the photoreceptor, create or write a latent electrostatic image on the photoreceptor as the photoreceptor is moved in synchronism therewith. Following this, the latent electrostatic image is developed, transferred to a suitable copy substrate material such as a copy sheet, and thereafter fused or fixed to provide a permanent copy.

However, the number of LEDs that can be packed onto a single chip or wafer is limited, and this, in turn, limits the image resolution that can be achieved with a single LED array. Joining several of the smaller LED arrays together to form a longer array, and particularly, to form a full page width array with increased resolution along with the attendant simplification of the printer optical system that this allows is desirable.

A primary limitation on resolution and density of a full page width LED array is the need to wire each individual LED to an off-chip driver circuit. Much higher resolution and lower cost can be achieved if the drive circuitry can be on the same chip as the LED. This would eliminate much of the hybrid wiring normally required. Moreover, if these self-driving chips could be accurately cut and butted to form a continuous single line LED array, this would eliminate expensive optical or electronic stitching methods. III–V class LED materials such as GaP and GaAs, when used as substrates, are easily damaged by saw cutting. Therefore, LED chips or arrays cannot normally be effectively butted together but instead must be staggered in rows and then optically interlaced with rather complex and relatively expensive optical means such as gradient index fiber lenses. Moreover, present state-of-the-art microelectronics based on III–V materials limits the use of on-chip circuitry and control. If LED Arrays could be built on, and made fully compatible with, silicon technology, the control circuitry can be integrated on-chip resulting in low-cost, small, reliable systems.

Recently, porous silicon, a spongy phase of Si, has been shown to efficiently emit light. It has been demonstrated that crude electroluminescence devices employing porous silicon and simple electrodes in a sandwich configuration can be made, See Microcrystalline Semiconductors: Material Science & Devices, *Research Society Symposium Proceedings*, Vol 283, 1993 and U.S. Pat. No. 5,272,355 which discloses a method for forming a porous silicon etectroluminescence device which includes electrochemically etching a silicon wafer to form a porous silicon region therein, depositing a transparent semiconductor layer on the porous silicon region, and forming a back contact on the wafer.

While, these prior porous silicon devices offer promise for use in low resolution displays they have been found unsuitable for forming high speed, high resolution LEDs for LED Arrays.

The present invention overcomes various of the above-discussed and other problems, and provides various of the above-noted and other features and advantages.

In accordance of the present invention, there is provided a semiconductor light emitting diode (LED) device which includes a switch diode, a porous silicon LED and a silicon wafer. The switch and porous silicon LED are formed on the surface of the silicon wafer.

Another aspect of the invention there is provided a method for fabricating a color- and grey-scale capable, high-speed, high-resolution silicon-based LED array, comprising the steps of: fabricating drive circuitry on a silicon chip. The step of defining an area on the silicon chip. The step of depositing crystalline silicon in the area. And the step of electrochemical etching the crystalline silicon, wherein the electrochemical etching step includes transmitting current through the drive circuitry to the crystalline silicon during etching to form a porous silicon LED element from the crystalline silicon in the area.

Other aspects of the present invention will become apparent as the following description proceeds and upon reference to the drawings, in which.

Figure 1:
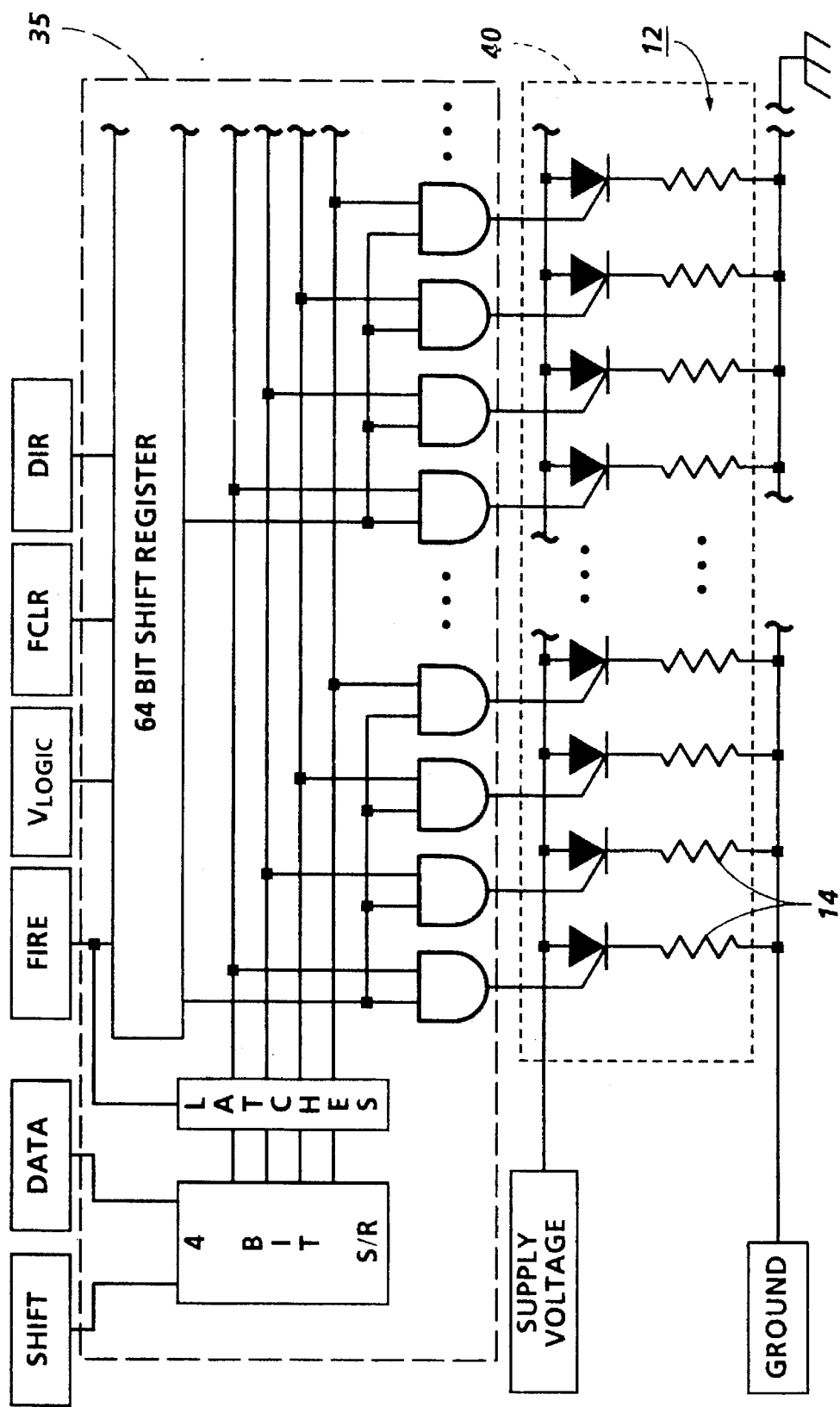
FIG. 1 is an illustrative schematic of the LED chip of the present inventions.

While the present invention will be described in connection with the preferred embodiment thereof, it will be understood that it is not intended to limit the invention to that embodiment. On the contrary, it is intended to cover all embodiments, modifications, and equivalents as may be included within the spirit and scope of the invention as defined by the appended claims. For a general understanding of the features of the present invention, references should be made to the drawings. In the drawings, like numerals have been used to identify identical elements.

Figure 16:
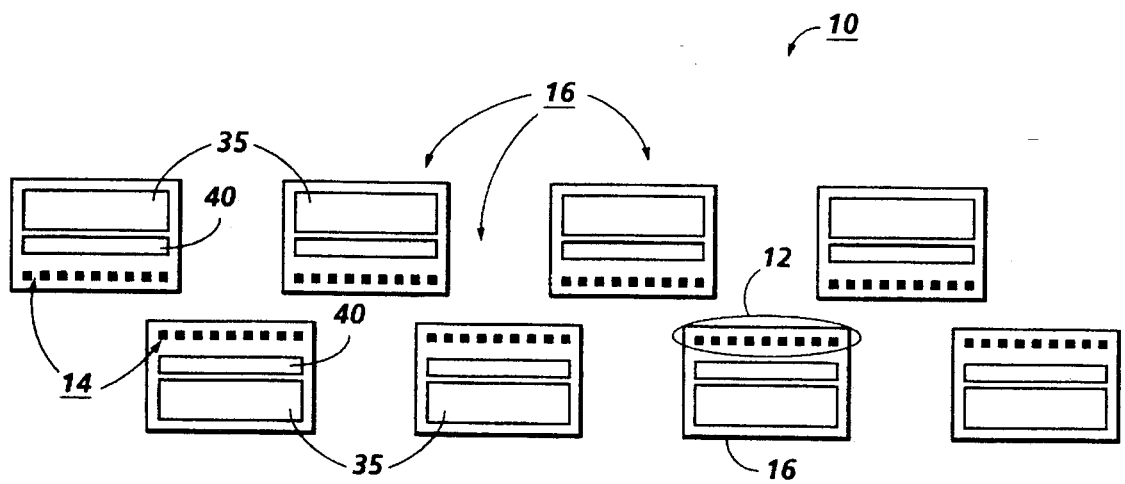
FIG. 16 is a view illustrating a plurality of LED chips assembled together in staggered fashion to form a full width write bar.
Figure 17:
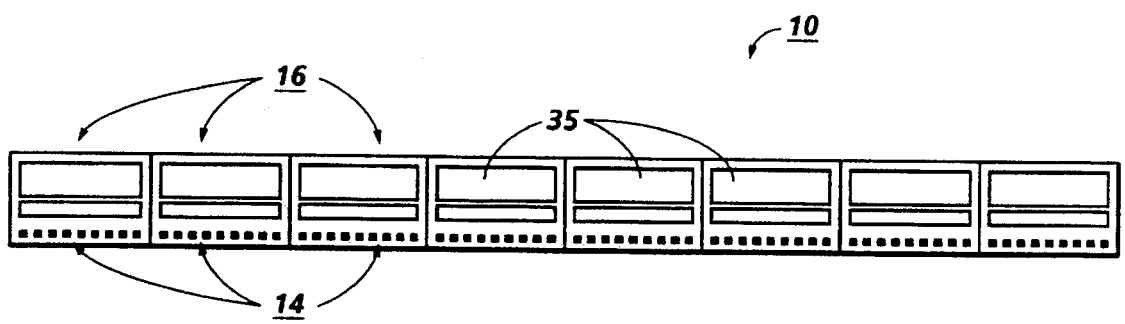
FIG. 17 is a view illustrating a plurality of LED chips butted together end to end to form a full width write bar.

Referring to FIGS. 16 and 17 there is shown the solid-state fullwidth write bar, designated generally by the numeral 10, of the present invention. Write bar 10 has at least one linear array 12 of Light Emitting Diodes (LEDs) 14. In the exemplary arrangement described herein, write bar 10 is used to write, either directly or through suitable lens means, images on a moving recording member such as a previously charged photoreceptor (not shown) of a xerographic system through selective actuation of the individual LEDs 14 in the array 12 in accordance with an image signal or pixel input. For this purpose, the write bar 10 has an overall length equal to or slightly greater than the effective width of the photoreceptor. Ordinarily, write bar 10 is disposed at right angles to the direction of photoreceptor movement and in predetermined spaced relation to the surface of the photoreceptor as will be understood by those skilled in the art. As a result, write bar 10 writes, i.e. exposes, the photoreceptor a line at a time as the photoreceptor moves therepast to create a latent electrostatic image represented by the image signal input to write bar 10. Following writing of the image on the photoreceptor by write bar 10, the latent electrostatic image created on the photoreceptor by LED write bar 10 is developed and transferred to a suitable copy substrate material such as a copy sheet. The copy sheet bearing the transferred image is thereafter fused or fixed to render the copy permanent while the photoreceptor is cleaned in preparation for recharging.

Write bar 10 is formed from a plurality of generally rectangular substrates or chips 16 separated by sawing or other suitable means from one or more circular silicon wafers (not shown). Chips 16 may be assembled in the staggered relationship as shown in FIG. 16 or butted end to end as shown in FIG. 17 to form a write bar 10 of desired length. Where chips 16 are disposed in staggered fashion, the chips may, for example, be operatively joined or stitched together by suitable electrical circuitry effective to crossover from one chip to the next when writing an image line without loss or distortion of the image at the chip junctions. Alternately, chips 16 may be optically joined or stitched together to in effect remove the stagger and align the images produced by each chip at the recording member without loss or distortion of the image at the junctions between chips. Where a plurality of chips 16 are arranged in end to end relation, the chips, following alignment with one another, are joined together by suitable means to provide a write bar 10 of desired length.

Figure 2:
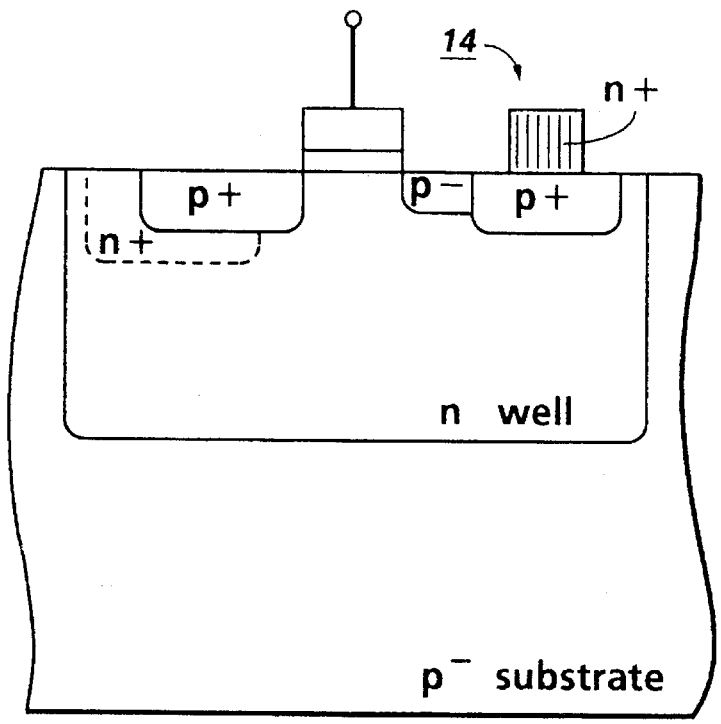
FIGS. 2–5 are exemplary embodiments of the switch diodes which may be utilized in the present invention.
Figure 3:
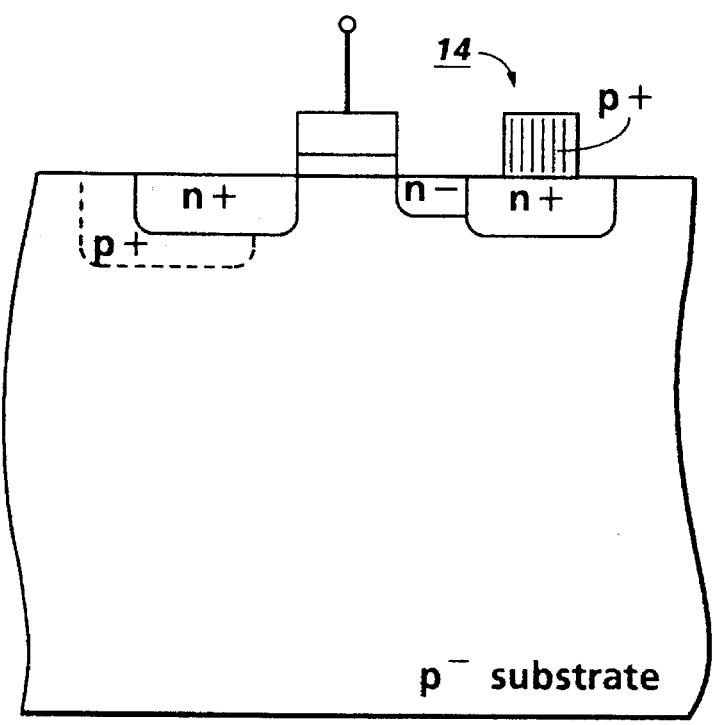
Figure 4:
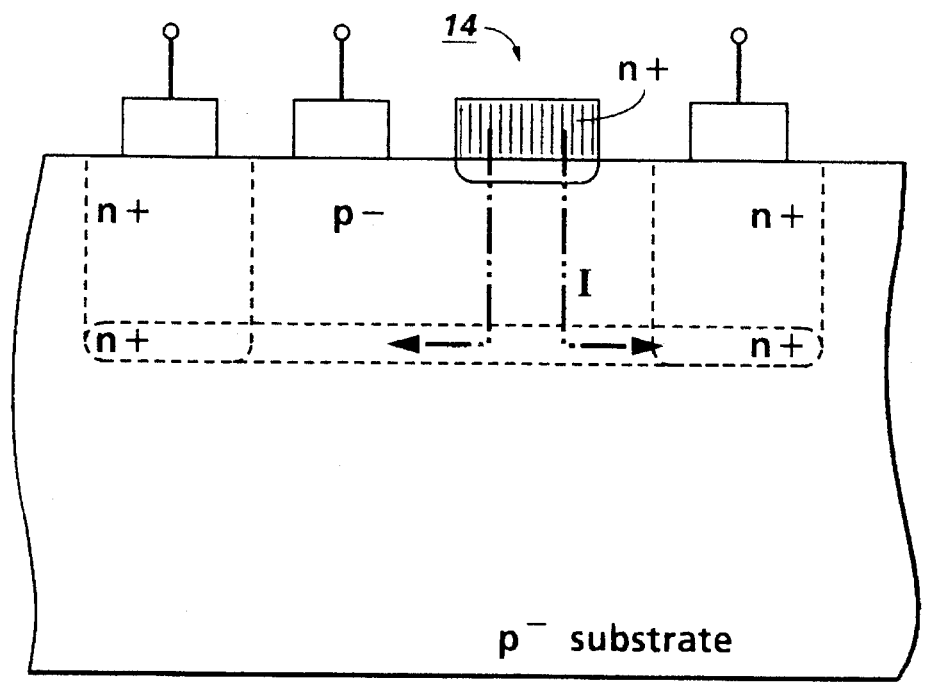
Figure 5:
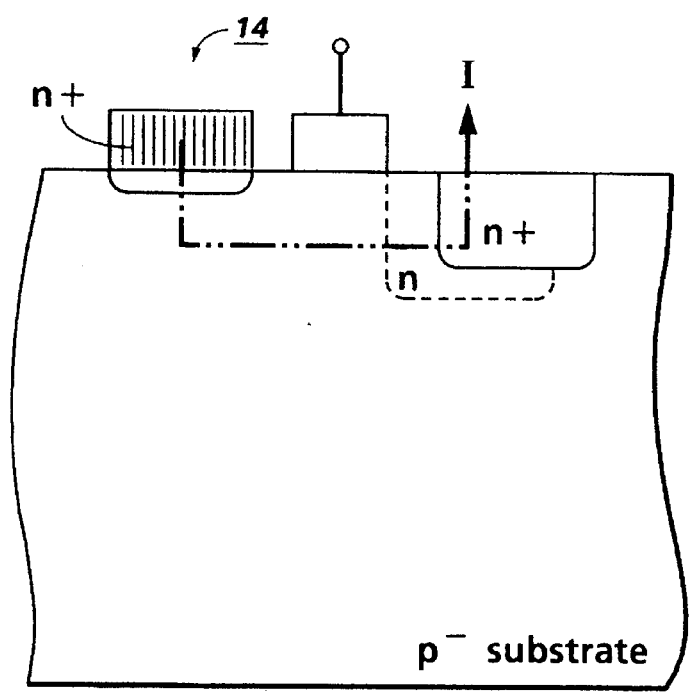
Figure 6:
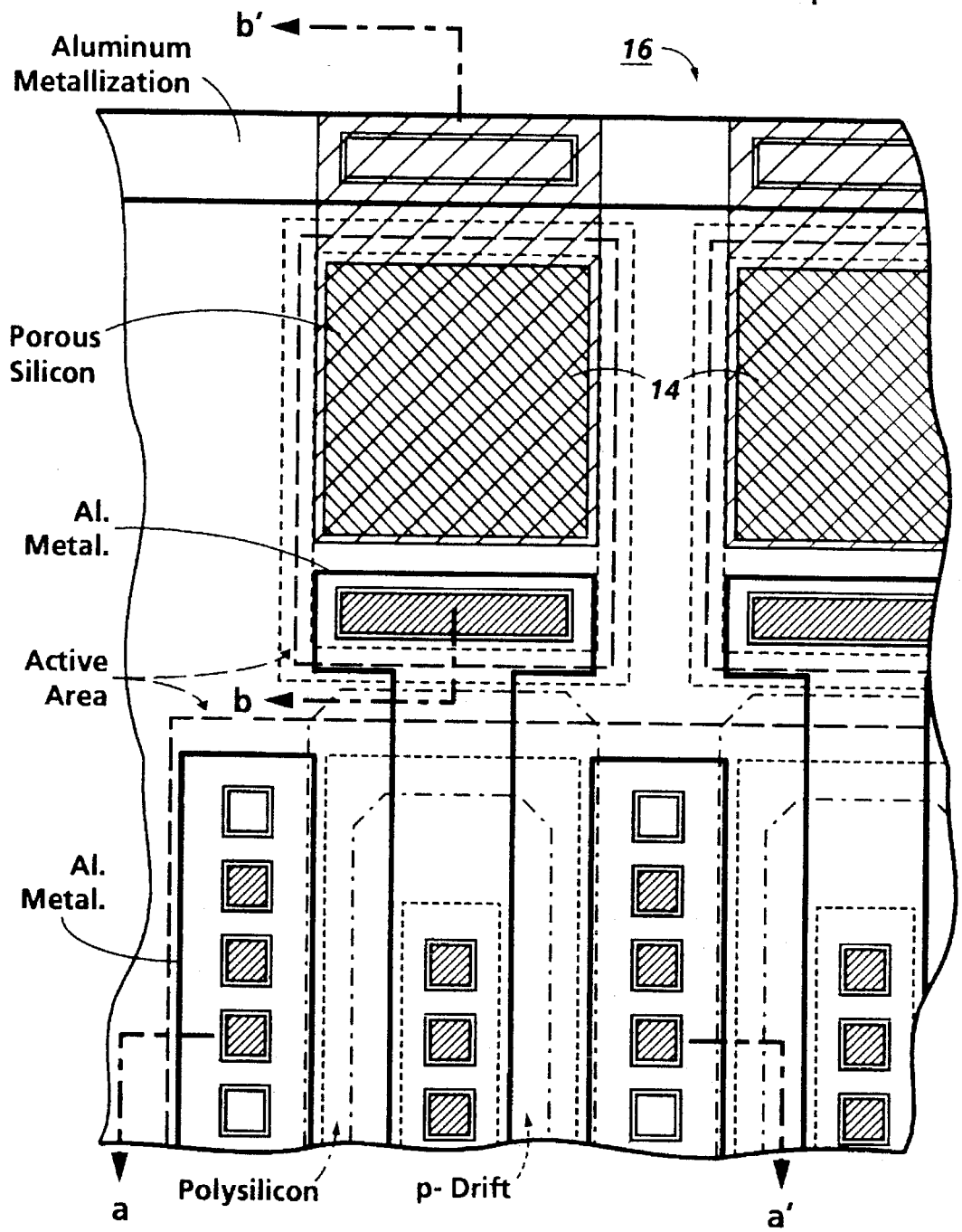
FIG. 6 is a top view of a portion of the LED chip of the present invention.
Figure 18:
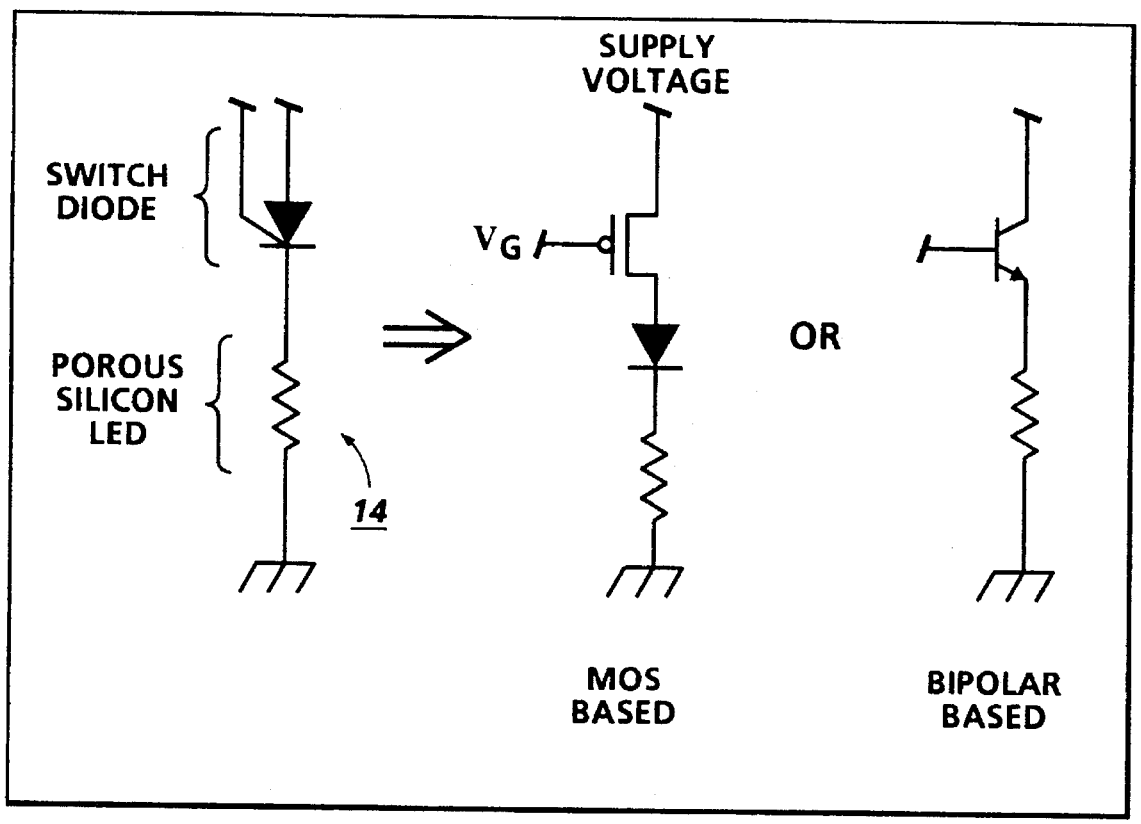
FIG. 18 is an illustrative schematic of the porous silicon LED connected to the switch diode.

Referring to FIG. 1, drive circuitry is fabricated on chips 16 such as an array of switch diodes 40. Switch diodes 40 are used to form the porous silicon LED elements during LEDs fabrication, and drive the LEDs after they are fabricated. Preferably, switch diodes consist of a high-voltage driver metal-oxide-semiconductor transistor (MOSFET) in series with a diode, as shown in FIG. 18. A p-n diode of which the n-side is the porous silicon LED elements can be used in series with a lateral power p-MOSFET to supply the current, as shown in FIG. 2. Similarly, a n-p diode of which the p-side is the porous silicon LED can be used in series with a lateral power n-MOSFET to supply the current, as shown in FIG. 3. It should be evident that other switch diodes based on vertical power MOSFETs, insulated-gate transistors or bipolar transistors can be employed in the present invention, as shown in FIGS. 4 and 5.

Supporting circuitry 35 such as a suitable addressing circuit and signal processing circuitry may be fabricated on chip 16 before fabrication of the porous silicon LED element using conventional silicon Integrated Circuit (IC) technologies such as nMOS, CMOS or BICMOS. Signal processing circuitry 35 provides image signals to the chips 16 of write bar 10, either in parallel to the chips or serially to all chips of bar 10 in a preset sequence, or in a suitable serial/parallel combination.

Preferably supporting circuitry 35, switch diodes 40 and LED 14 elements are simultaneously fabricated on the chip. This process yields a less complex masking process, resulting in a low-cost monolithic integrated-circuit chip having supporting circuitry, switch diodes, and LEDs integrated thereon as illustrated schematically in FIG. 1. Chip 16 is divided into 3 types of electrical elements: Signal processing circuitry 35, switch diodes 40 and LEDs 14. In the example schematic in FIG. 1 the switch diode and LED arrays consists of 256 elements, of which 4 are addressed simultaneously. It should be evident that other addressing schemes and element numbers are possible.

With respect to the present invention, the fabrication process of a chip 16 is discussed in detail below using one example of lateral power p-MOSFET in series with p-n diode. Lightly-doped, p-type,<100> oriented silicon wafers are used. Optical alignment marks are defined by etching pits into chip 16. Next, a 2 micron thick oxide is deposited and patterned to mask against the deep n-well implant. High temperature anneal is used to drive-in the n-well. After stripping the masking oxide, a thin pad oxide ($SiO_2$) is grown and a nitride layer is deposited and patterned. After the n-type channel stop implant is performed, a thick field oxide is grown which defines the active areas where signal processing circuitry 35, switch diodes 40 and LED elements 42 will be formed.

Figure 7:
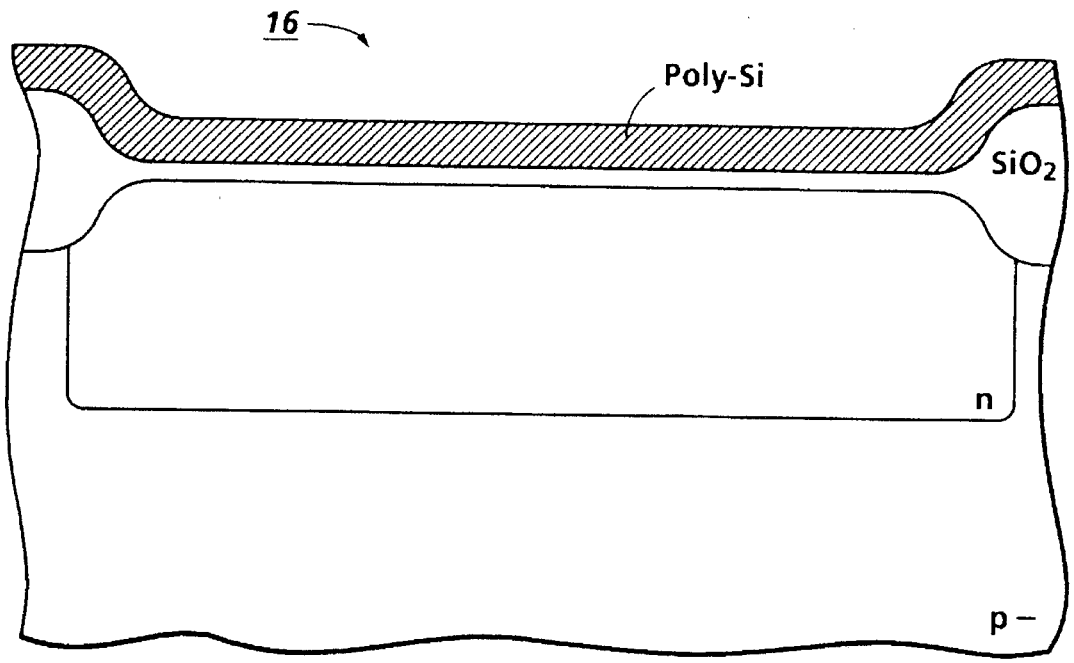
FIG. 7 is a side view of the active area in which the switch diode and LED will be formed.
Figure 8:
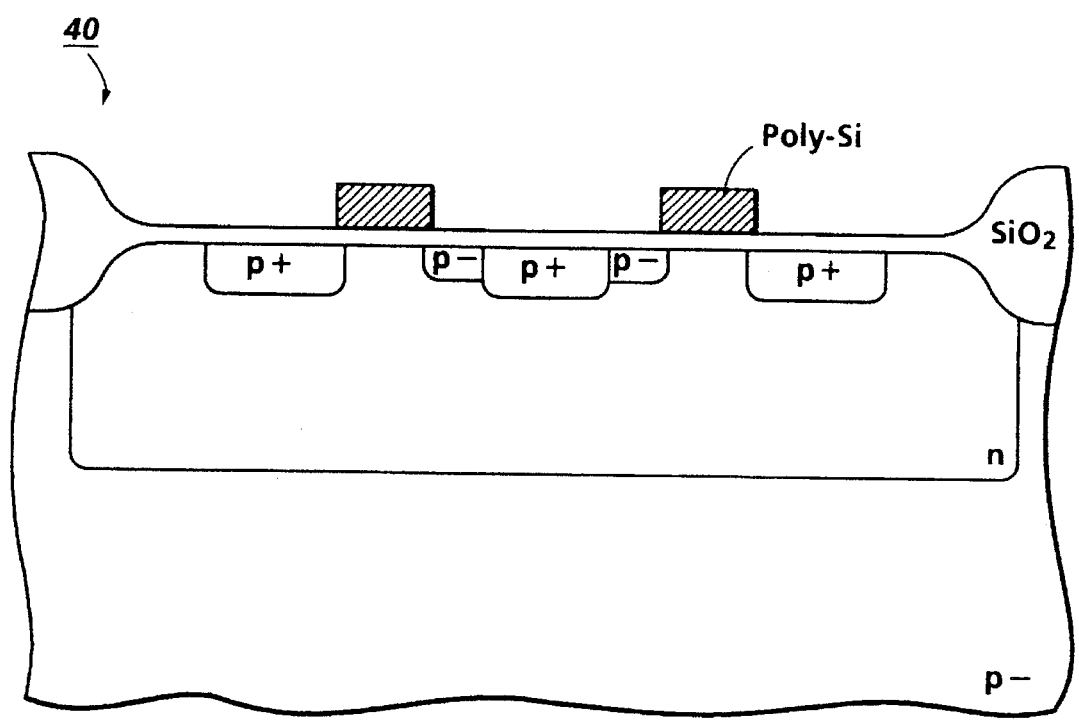
FIGS. 8–10 are side views (view a—a' of FIG. 6) of the switch diode utilized in the present invention in exemplary modes of fabrication in accordance with the teachings of the present invention.
Figure 11:
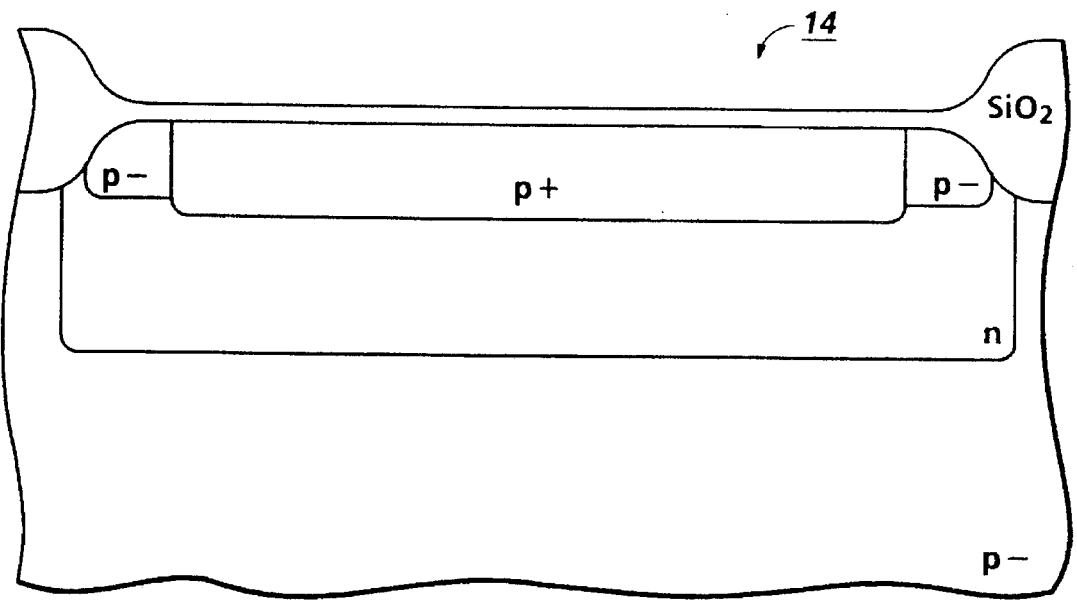
FIGS. 11–14 are side views (view b—b' of FIG. 6) of the LED utilized by the present invention in exemplary modes of fabrication in accordance with the teachings of the present invention.

After removing the silicon nitride layer and underlying $SiO_2$ layer, a sacrificial oxide layer is grown. A photoresist mask is used to define the areas which need to receive the transistor threshold adjustment implant. After stripping the mask layer, the sacrificial oxide layer is etched and a high-quality gate oxide is grown followed by a polysilicon deposition and doping (FIG. 7). The polysilicon is etched, using a photoresist mask layer, to define the power transistor and logic control electronic gates. The polysilicon is removed over the entire LED area. Next a blanket low-dose p-type implant (such as boron) is performed and this implant will define the drift region in the driver transistor and provide a guard ring between the highly-doped p-side of the diode and the field-oxide edge. A photoresist mask is used to define the highly-doped source/drain areas and the p+ side of the LED diode. In addition, some of the driver source contacts, preferably one in every fourth, are masked to shield them from the p+ implant. At this stage in the process, FIG. 8 illustrates the p-MOSFET driver transistor and FIG. 11 illustrates the LED.

Figure 9:
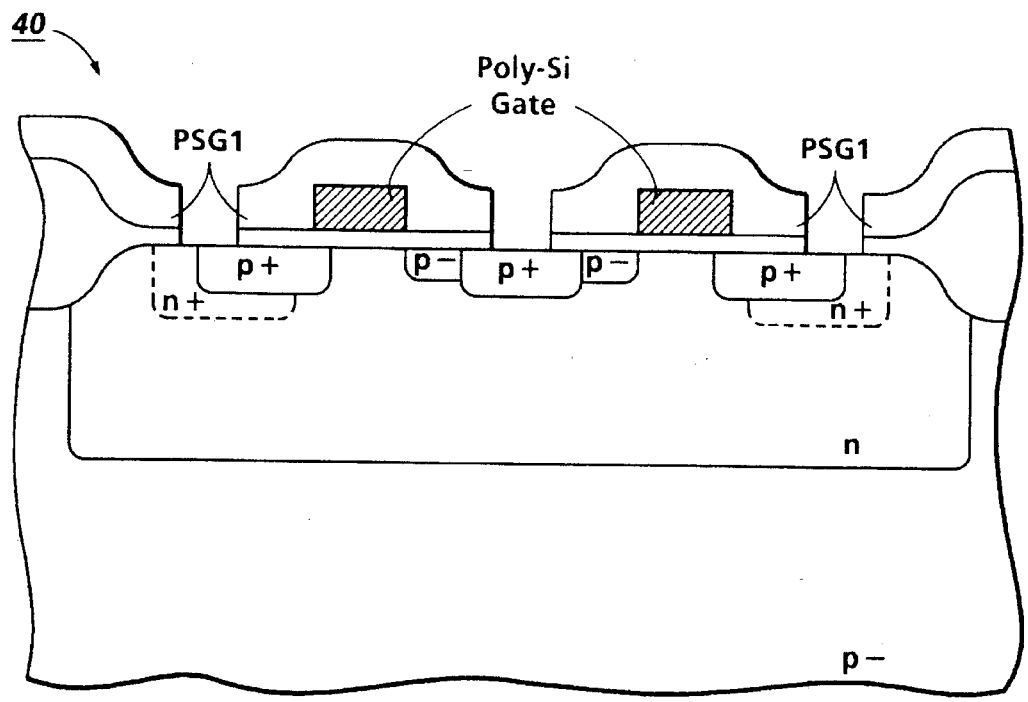
Figure 12:
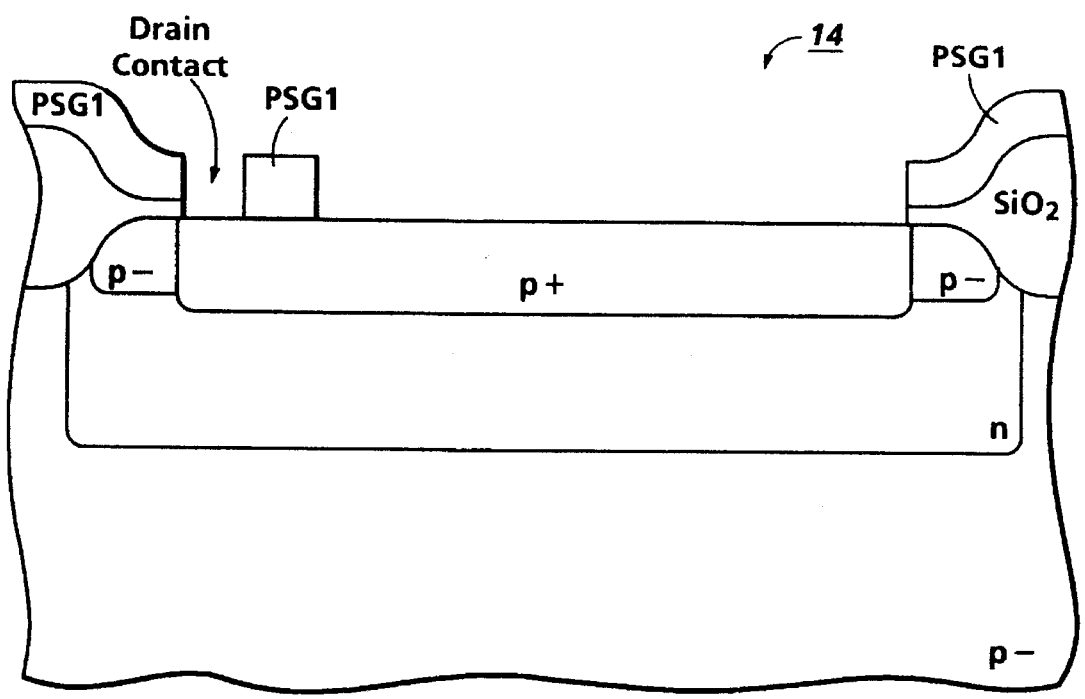

Next a photoresist mask is patterned and a highly doped n+ implant is used to contact the n-well and provide a shield underneath the source of the p-MOSFET driver in order to obtain a reliable, snap-back robust driver transistor. The n-well contacts provide good grounding through the top surface of chip 16, thereby minimizing parasitic bipolar effects. A 700-nm thick phosphosilicate glass (PSG1) is next deposited, patterned, and densified, to define the source/drain, and gate contact holes in the driver (as shown in FIG. 9), and the contact hole to the LED and the active LED area (as shown in FIG. 12).

Figure 10:
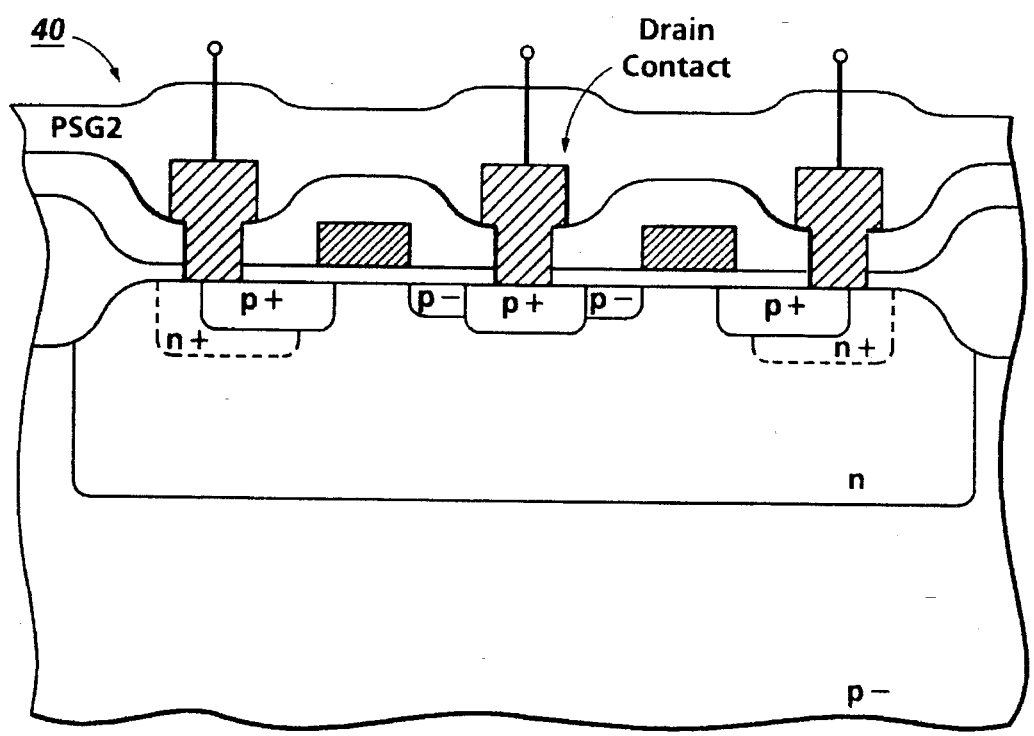

Next, the aluminum interconnect metallization is deposited, patterned, and alloyed. The drain of the p-MOSFET driver is contacted to the p+ side of LED element 42. A second 2-micron thick phosphosilicate glass (PSG2) is deposited, patterned, and densified to define the active LED element area 42. The thickness of the PSG2 layer is determined by the desired thickness of the porous silicon layer. At this stage of the process the p-MOSFET driver is completed, as shown in FIG. 10. The driver is fully functional and can be operated by applying the appropriate gate, source and drain biases. Next, the process silicon LED elements will be fabricated.

Figure 13:
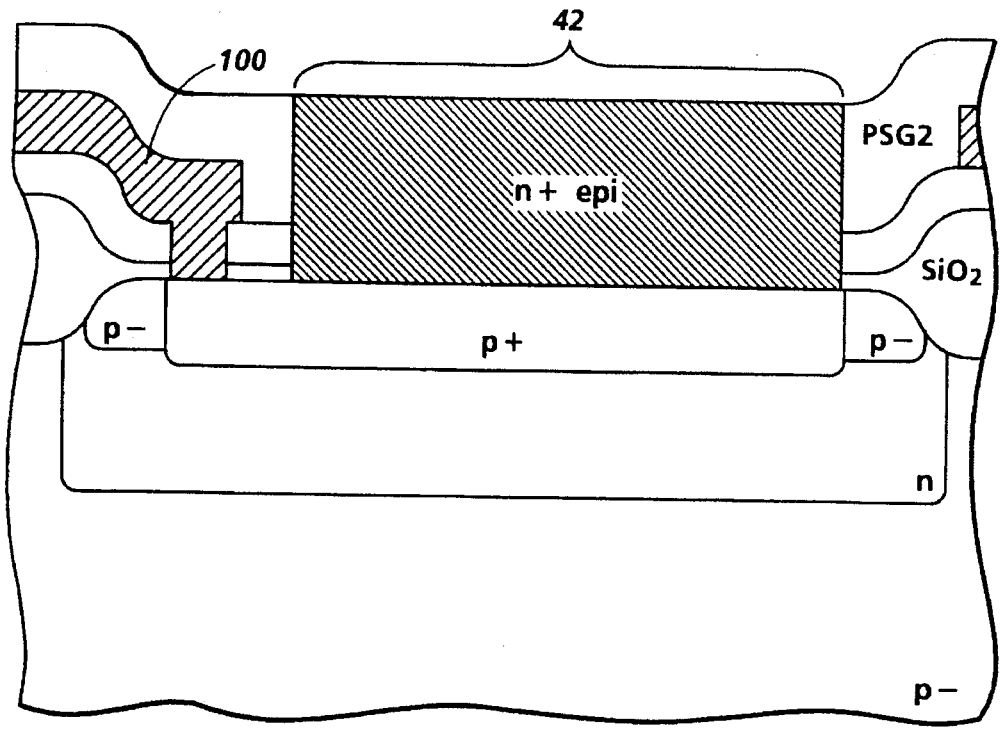

Referring to FIG. 13, a crystalline silicon LED element will be grown in LED element area 42 which will form the n+ porous silicon side of the LED diode. Crystalline silicon (preferably highly n-type doped epi silicon) is grown in LED element area 42 using selective epitaxy (such as Vapor Phase Epitaxy). As a result of using selective epitaxy, epi silicon will only grow in LED element area 42.

The epi silicon in LED element area 42 is furthered processed to produce porous silicon by employing electrochemical etching (10 mA/cm$^2$) in HF:H$_2$O (1:3). Since at this point in the process only the silicon which will need to be converted to porous silicon is exposed, no photoresist layer is required. This is a fully self-aligned process. The wafer, which contains the individual chips 16, is immersed in an electrochemical cell (HF/ethanol) and illuminated by light, preferably by light in the visible to UV range. The p-MOSFET drivers flow current through the epi silicon through interconnect 100. The ground path and V$_{DD}$ path on each chip 16 are shorted through the use of a sacrificial metal connection. This layer shorts the bonding paths of different chips and will be cut when the chips are separated during wafer dicing. Only two external connections to the wafer need to be made: ground and supply voltage.

Figure 15:
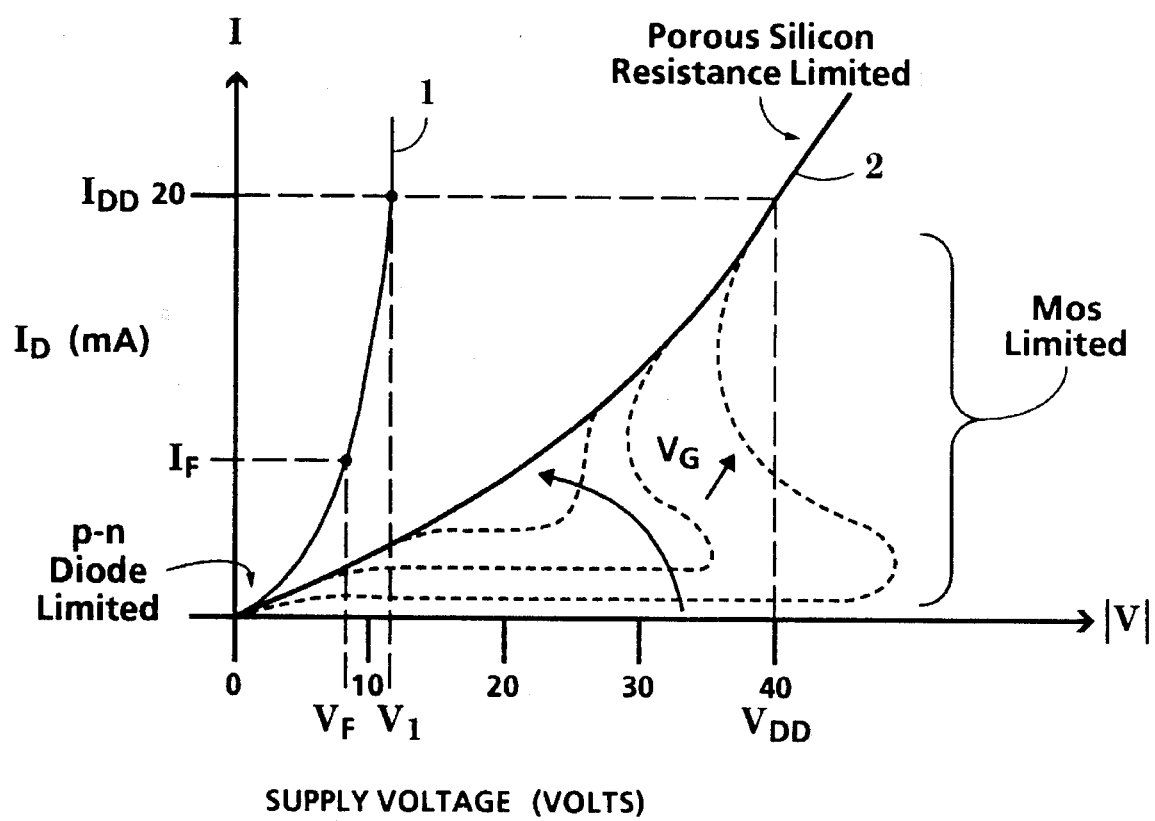
FIG. 15 illustrates the current-voltage characteristics of the switch diode, before (1) and after (2) porous silicon LED fabrication.

Next, proper bias conditions are applied to the p-MOSFET driver during a porous silicon fabrication. FIG. 15 is a graphical illustration of the current-voltage characteristics of the switch diode (i.e., p-MOSFET connected to the p-n diode FIG. 18) based, before (1) and after (2) porous silicon fabrication. Before porous silicon fabrication the epitaxial n+ silicon side of the diode has a low series resistance. During the electrochemical etching, porous (i.e. column-like) structures in the epitaxial silicon are produced. Three electrical operating regions can be distinguished in FIG. 15. The switch diode consists of a diode in series with a MOSFET, and hence the voltage across the diode has to be at least 0.7 V before the device will start conducting current (i.e., for V<0.7 V; the device is p-n diode limited). For low p-MOSFET driver gate bias the resistance of the p-MOSFET determines the behavior of the switch diode (i.e., for low V$_G$, the device is MOS limited). When the p-MOSFET driver is fully on (i.e., gate voltage higher than required by total resistance of the structure), the switch diode is limited by the series resistance of the porous silicon (i.e., porous silicon LED resistance limited). The resistance increases during porous silicon formation and the current-voltage characteristic moves to higher voltages as indicated by line (2) in FIG. 15. During etching, the initial voltage is low (V1) and (V1) for a given current will increase with etching time. It is preferred during fabrication that all LED diodes are etched simultaneously, and hence all p-MOSFET drivers are turned on at the same time. Therefore the current has to be low enough such that the chip interconnects can support it. During LED operation (i.e., after the device is finished), four or eight LEDs can be addressed at once, and the interconnect layers are optimized for that type of current density. During fabrication all LEDs will be addressed at once and therefore the current in an individual LED has to be limited as indicated by the (I$_F$, V$_F$) condition in FIG. 15.

The electrochemical etching is stopped when the column-like Si structures are on the order of 50 to 100 nanometers in diameter which can efficiently emit visible to infrared light. However, an advantageous feature of the present invention is that the emission wavelength is controlled by the electrochemical conditions. It has been shown that with electrochemical etching the emission wavelength of the LED can be altered from >750 nm (10 min. etch @ 10 mA/cm$^2$) to 560 nm (120 min. etch @ 10 mA/cm$^2$). Further blue shifting (<500 nm) of the emission can be achieved by annealing (800° C.) in oxygen following electrochemical etching. Also, since logical circuits can control each driver on a chip separately while the chip is being electrochemically etched, it has been contemplated that each LED on the same chip can have different light wavelength emissions by selectively turning on and off each driver for each LED chip.

Figure 14:
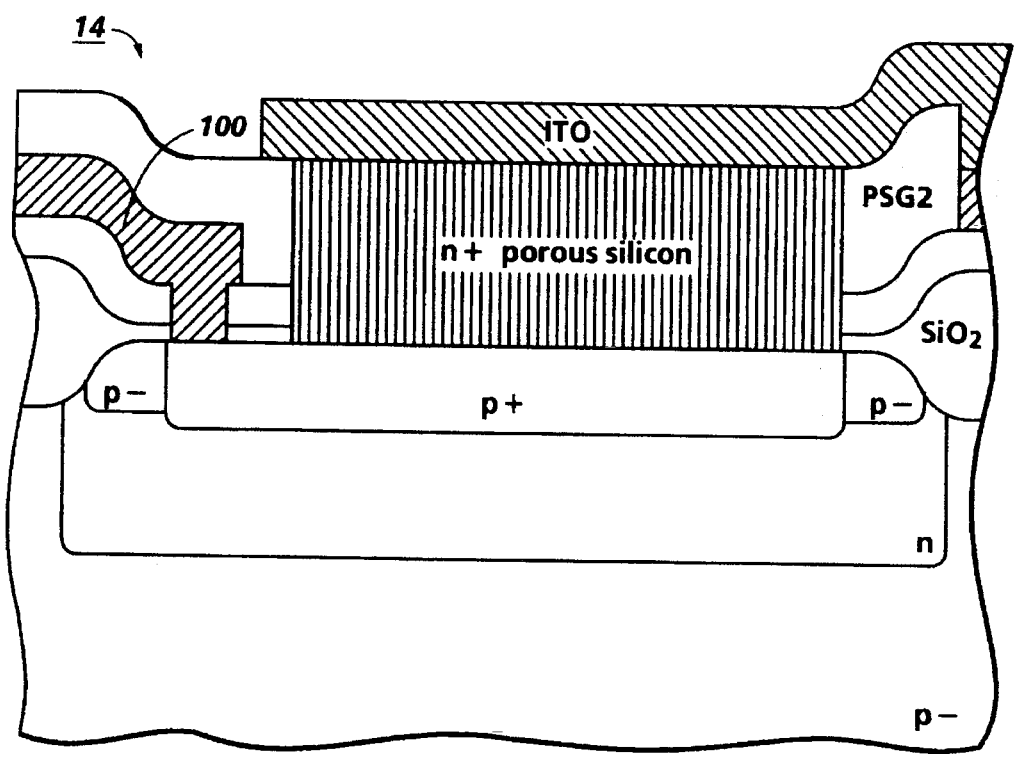

The porous silicon LED array fabrication is completed by depositing and patterning a transparent electrode, such as indium tin oxide (ITO), which connects the porous silicon LED elements to the ground bus, as shown in FIGS. 14.

With the foregoing description of the elements and their organization with respect to each other in the chip, the operation of the individual LED diode is described below. The embodiment as described herein of the LED diode is a p-n junction with porous silicon being the n-region. Under forward bias holes are injected from the p+ region underneath, into the porous silicon valence band while simultaneously the transparent electrode atop injects electrons into the porous silicon conduction band. These two carriers (holes and electrons) recombine radiatively within the porous silicon, thereby producing the emission (electroluminescence). The wavelength of the emission is controlled by the relative position (energy) of the valence and conduction bands (i.e., the bandgap) in the porous silicon. The bandgap is controlled by the relative dimensions of the columnar structure (as the columns become narrower, the bandgap increases).

One advantageous feature of the present invention is that high resolution LED arrays can be fabricated by placing more elements per inch. This can be accomplished by standard microelectronics fabrication technologies. Another advantageous feature of the present invention is that it is gray-scale capable. The emission intensity of each LED or all LEDs on a chip can be varied by changing the current or supply voltage to the driver(s) of the LED(s). For example, the driving current can be modified by changing the supply voltage.

In recapitulation, there has been provided a method which allows fabrication of Light Emitting Diodes (LEDs) with supporting circuits integrated on the same silicon chip or wafer. Switch diodes are fabricated on the chip and are used to fabricate porous silicon LED elements. The same switch diodes later drives the LED elements after they are fabricated. The individual LED elements are formed by defining an area on the chip for placing an LED element. The size of the area depends on the LED resolution. Highly-doped epitaxial (epi) silicon is grown in the defined area; and the epi silicon is electrochemically etched to produce porous silicon while the switch diodes are in an operative mode. This procedure creates column-like silicon structures in the defined area of nanometer dimension which can efficiently emit blue (<500 nm) to infrared (>750 nm) light at room temperature. In this way, the chips bearing both LEDs and drive circuitry are made of silicon and can be cut and accurately butted by known techniques to form a color- and gray-scale capable, low-cost, high-resolution Full-Width LED Array.

It is, therefore, apparent that there has been provided in accordance with the present invention, a method of fabricating an LED array that fully satisfies the aims and advantages hereinbefore set forth. While this invention has been described in conjunction with a specific embodiment thereof, it is evident that many alternatives, modifications, and variations will be apparent to those skilled in the art.

Accordingly, it is intended to embrace all such alternatives, modifications and variations that fall within the spirit and broad scope of the appended claims.

We claim:

1. A method for forming a high speed, high resolution LED, comprising the steps of:

fabricating drive circuitry on a silicon chip;

defining an area on the silicon chip;

depositing crystalline silicon in the area; and electrochemical etching the crystalline silicon, said electrochemical etching step includes operating the drive circuitry to form a porous silicon LED element from the crystalline silicon in the area.

2. The method of claim 1, wherein said etching step further includes the step of illuminating the defined area.

3. The method of claim 1, further comprising the step of varying the time of said etching step to produce an LED that emits a selected wavelength.

4. The method of claim 1, further comprising the step of annealing the silicon chip after said etching step to produce an LED that emits a selected wavelength.

5. The method of claim 1, further comprising the step of connecting the silicon chip to a current source.

6. The method of claim 1, further comprising the step of connecting the porous silicon LED element to a supply voltage.

7. The method of claim 1, further comprising the step of combining a plurality of LEDs to form an array.

* * * * *